April 9, 1963

C. S. FULLER 3,085,032

TREATMENT OF GALLIUM ARSENIDE

Filed Feb. 26, 1960

INVENTOR
C.S. FULLER
BY H. W. Lockhart
ATTORNEY

United States Patent Office 3,085,032

Patented Apr. 9, 1963

3,085,032

TREATMENT OF GALLIUM ARSENIDE

Calvin S. Fuller, Chatham, N.J., assignor to Bell Telephone Laboratories, Incorporated, New York, N.Y., a corporation of New York Filed Feb. 26, 1960, Ser. No. 11,204
2 Claims. (Cl. 148—1.5)

Figure 2:
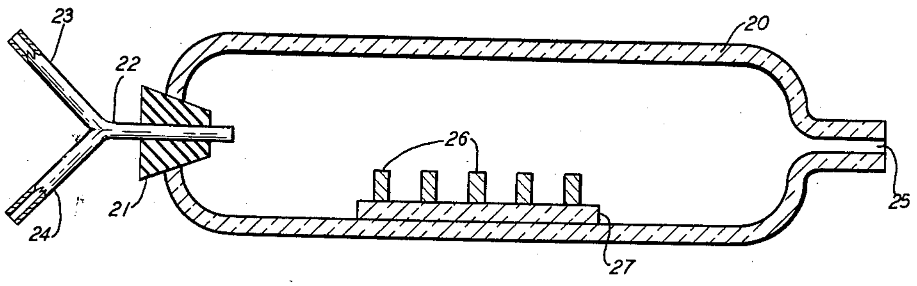

This invention relates to semiconductor devices and, more particularly, to methods of fabricating PN junctions in gallium arsenide semiconductor material.

Gallium arsenide is an advantageous semiconductor material from a number of standpoints. It has an energy gap which is larger than that of silicon, its electron mobility is greater than that of germanium and its dielectric constant is smaller than that of both germanium and silicon. Consequently, gallium arsenide diodes offer desirable characteristics for both high frequency and high temperature applications. One such device of the point contact type is disclosed in the application of W. M. Sharpless, Serial No. 771,881, filed November 4, 1958, now Patent No. 2,995,475, issued August 8, 1961.

In accordance with this invention, gallium arsenide semiconductor devices having relatively large area PN junctions are fabricated by the solid state diffusion of silicon using as sources certain compounds thereof, particularly the halides and hydrides of silicon. Certain other group IV elements such as germanium and tin provide compounds useful as diffusion sources but have less advantageos electrical effects.

A broad object of this invention, therefore, is the fabrication of gallium arsenide semiconductor devices.

A more specific object of the invention is a method for diffusing silicon in gallium arsenide semiconductor material thereby to alter the conductivity of said material.

It has been determined that silicon affects gallium arsenide predominantly as a donor. Silicon also may act secondarily as an acceptor, the proportional amount of silicon acting as an acceptor increasing as the total concentration of silicon increases. However, even at high silicon concentrations the donor effect appears to dominate. Therefore, this invention is most advantageously used to increase the electron concentration of the material and thus to provide either more highly-doped N-type layers in N-type material to facilitate making low resistance electrical connection thereto or to convert a portion of P-type conductivity material to N-type and thereby to make a PN junction.

In one form the method of this invention comprises heating slices of P-type monocrystalline gallium arsenide, which are enclosed in a sealed container, with a predetermined concentration of silicon tetrachloride in vapor form. This heating, typically, is at a temperature in the range from about 600 to 1200 degrees centigrade and for a period of from about one hour to several hundreds of hours.

After the diffusion process the gallium arsenide slices are removed from the container and processed further in accordance with conventional techniques to realize useful device structures. Typically, the slices exhibit a diffused N-type surface region, the depth of which may range from one micron to about one mil, where 1 micron $=3.94\times10^{-5}$ inches and 1 mil $=1\times10^{-3}$ inches.

The method of this invention is particularly useful for producing degenerate, that is, high conductivity surface layers on N-type conductivity gallium arsenide. Customarily, gallium arsenide, having electron concentrations of less than about $10^{18}$ per cubic centimeter, exhibits a high surface resistivity which makes it difficult to effect low resistance electrical contact thereto.

Furthermore, by employing the method of this invention to convert P-type material to N-type conductivity, it becomes practicable to produce planar PN junctions at precisely controllable depths and over relatively large areas. This diffusion is accomplished advantageously using certain halides and hydrides of silicon in contrast to diffusion treatments using other significant impurities which require higher temperatures and generally result in significant surface erosion of the slices. Particular advantages arise because the halides and hydrides useful for this invention are readily supplied in gaseous form, thus enabling rather precise control of the quantity supplied to the process.

Accordingly, a feature of this invention is apparatus for heating gallium arsenide semiconductor material at controlled temperatures in the presence of particular silicon compounds for extended periods of time thereby to induce conductivity alterations in the semiconductor material.

Figure 1:
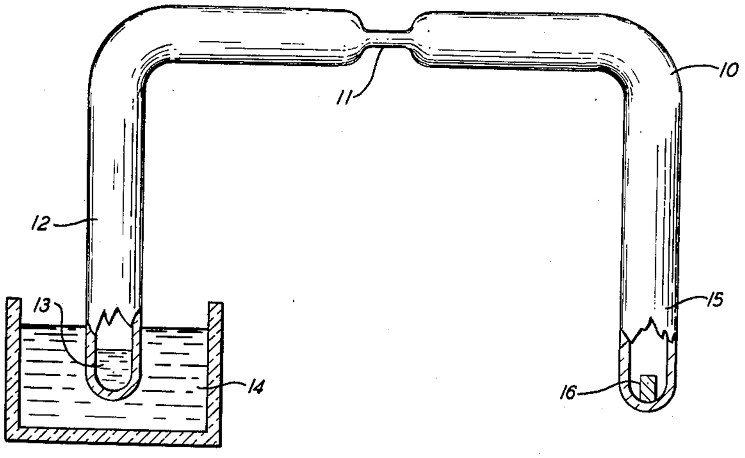

The invention and its other features and objects will be more clearly understood from the following detailed description taken in connection with the drawing in which:

FIG. 1 depicts in schematic form apparatus for accomplishing the invention by the closed-tube method; and FIG. 2 is a schematic illustration of apparatus for carrying out the invention by an open-tube method.

The simplified apparatus in FIG. 1 provides means for employing a closed-tube method of diffusion. In accordance with this method, a predetermined quantity of the significant impurity is placed in an enclosure with the gallium arsenide slices and heated in this sealed condition until substantially all of the significant impurity is depleted. The inverted U tube 10 has a necked-down central portion 11 which may be used for sealing off the right-hand portion after it has been charged with a silicon tetrachloride gas. Initially, the left-hand portion 12 of the tube containing silicon tetrachloride 13 in liquid form is immersed in a bath 14 which is at a controlled temperature. Because silicon tetrachloride is a liquid between —70 degrees centigrade and 57.7 degrees centigrade, the partial pressure of the silicon tetrachloride vapor can be controlled by controlling the bath temperature between these two points. A suitable bath is one of acetone and dry ice or, for higher temperatures, a salt-ice bath. As a preliminary to this method, a quantity of silicon tetrachloride 13 in excess of the amount required, is placed in the left-hand portion 12 of the tube. This portion 12 then is immersed in the bath 14 at the proper temperature to establish the desired pressure in tube 10. Thus, the quantity of significant impurity supplied is stated in terms of the silicon tetrachloride gas pressure. The initial step consists merely of placing the tube containing the silicon tetrachloride liquid in the bath for a brief period of the order of minutes. This is sufficient to stabilize the silicon tetrachloride vapor pressure within the U tube. The two portions of the tube then are separated by sealing off the right-hand portion 15 containing the gallium arsenide slices 16. The tube portion 15 then is inserted into a furnace heated to the required diffusion temperature in the range between 600 degrees centigrade and 1200 degrees centigrade. After heating it for a time sufficient to substantially completely deplete all of the silicon from the source material, the tube is opened and the gallium arsenide slices are removed. They then have a silicon-diffused surface region of N-type conductivity material which depending on the time and temperature of the treatment, ranges in depth from about one micron to about one mil.

In one example, using the closed-tube arrangement of FIG. 1, several uniformly P-type conductivity slices of single crystal gallium arsenide (0.25 inch diameter and .015 inch thick) having a resistivity of 5 ohm centimeters were placed in one leg of the tube and the other end of the tube was loaded with about 500 milligrams of silicon tetrachloride in liquid form. The tube was then evacuated with the end containing the chloride immersed in liquid nitrogen and sealed off. The end containing the silicon tetrachloride was then immersed in a bath of dry ice and acetone at a temperature of —56 degrees centigrade. After about two minutes the two portions of the tube were separated and the portion containing the gallium arsenide slices was sealed off at the narrow portion with a silicon tetrachloride vapor pressure of about 8 millimeters of mercury.

This container was then heated in a furnace at 1100 degrees centigrade for a period of 24 hours. The slices of gallium arsenide after removal from the furnace and from the tube were observed to have a diffused N-type surface region about one mil in depth.

Using the same process, but heating at 820 degrees centigrade for 24 hours, slices were made having a diffused N-type surface region about two microns in depth.

Referring to FIG. 2, the apparatus comprises a tube 20 of alumina having inlet and outlet connections. The inlet end is closed by a stopper 21 fitted with a Y tube 22 having legs 23 and 24. The necked-down portion 25 at the other end of the tube forms an outlet to the atmosphere. A plurality of gallium arsenide slices 26, supported in an alumina rack 27, are placed within the tube 20. The slices 26, of P-type conductivity single crystal material, are etched and polished preparatory to the diffusion process. The tube 20 is mounted in a furnace capable of maintaining closely controlled temperatures at least in the range from approximately 600 degrees centigrade to approximately 1200 degrees centigrade.

In carrying out the method, the furnace is heated to the temperature at which the diffusion process is to be carried out. Typically, this is in the range of from 600 to about 1200 degrees centigrade. The tube then is thoroughly flushed using a pure atmosphere, typically, an inert gas. For this purpose a helium gas supply is connected to one leg 24 of the Y tube. Other gases, such as nitrogen, also may be used. After the assembly has been stabilized at the desired temperature, the silicon tetrachloride in gaseous form is introduced through the other leg 23 to mix with the carrier gas helium, which mixture then flows through the tube to the outlet at amospheric pressure. The concentration of silicon tetrachloride is controlled by adjusting the relative flow of the helium and silicon tetrachloride gas. Typically, the ratio of volumes may be in the range of about two parts $SiCl_4$ to 100 parts He. In most cases the partial pressure of the silicon tetrachloride gas ranges from about two to ten millimeters of mercury. A satisfactory gas flow is about 0.5 liter per minute through a furnace tube of 1 inch diameter. Following this diffusion treatment for a period which may extend from about one hour to several days, the silicon tetrachloride supply is cut off and the slices are removed from the tube. They then have a silicon-diffused surface region of N-type conductivity as in the case of the method described in connection with FIG. 1. The slices are processed further by the selective removal of material to produce devices including PN junctions.

More specifically, the gallium arsenide slices are prepared with at least one surface having a highly polished mirror-like finish. Thus, the diffusion from this surface will be highly planar and the PN junction thus formed can be most advantageously incorporated into a device structure. Generally, the depth of diffusion is a direct function of the time and temperature used in the diffusion treatment. Further, the depth of the PN junction is also a function of the concentration of the significant impurity material supplied to the diffusion chamber.

The material used for the containers in the above-described processes is a significant factor inasmuch as quartz tubes, which commonly are used for high temperature diffusion treatments evolve sufficient silicon at temperatures of from about 900 degrees centigrade and higher to affect the treatment significantly. Therefore, at temperatures in this range the use of material for the conainer such as alumina, or other non-contaminating metals such as molybdenum, is most advantageous.

Although the constants have not been fixed with complete accuracy, it appears that the diffusion coefficient of silicon in gallium arsenide is about $10^{-10}$ to $10^{-12}$ centimeters square per second at 1000 degrees centigrade. At a temperature of about 600 degrees centigrade, it appears that the diffusion coefficient is about $10^{-13}$ per square centimeters per second. On the basis of the foregoing determinations, N-type surface concentrations in the diffused areas of the order of about $10^{15}$ to $10^{18}$ atoms per cubic centimeter are realized.

In addition to the halide silicon tetrachloride, which has been disclosed herein as possessing certain advantages, other halides and hydrides of silicon, particularly those which exist in gaseous form at or near normal room temperatures, may be employed for this process. This property is particularly advantageous from the standpoint of control of the quantity of diffusant supplied as has been pointed out previously. For example, such compounds may include silicon dichloride, silicon tetrafluoride and difluoride and the hydrides, silane and disilane.

Further, certain other group IV elements notably germanium and tin, form compounds suitable for diffusion sources. In particular, germanium and tin tetrachloride may be used. However, silicon is more advantageous as a significant impurity because of its greater electronic effectiveness.

Although the invention has been disclosed in terms of several specific embodiments, it will be understood that these are but illustrative and that other techniques may be devised by those skilled in the art which will be within the scope and spirit of the invention.

What is claimed is:

1. The method of increasing the donor concentration of a surface portion of a gallium arsenide body by diffusing silicon into said surface portion comprising the step of heating the gallium arsenide body to a temperature of about 820 degrees centigrade for about twenty-four hours while exposing the surface portion to an atmosphere rich in silicon tetrachloride vapor.

2. The method of increasing the donor concentration of a surface portion of a gallium arsenide body by diffusing silicon into said surface portion comprising the step of heating the gallium arsenide body to a temperature of about 1100 degrees centigrade for about twenty-four hours while exposing the surface portion to an atmosphere rich in silicon tetrachloride vapor.

References Cited in the file of this patent

UNITED STATES PATENTS

| | | |
|---|---|---|
| 2,798,989 | Welker | July 9, 1957 |
| 2,880,117 | Hanlet | Mar. 31, 1959 |
| 2,895,858 | Sangster | July 21, 1959 |
| 2,928,761 | Gremmelmaier | Mar. 15, 1960 |
| 3,011,877 | Schweickert et al. | Dec. 5, 1961 |

OTHER REFERENCES

Schillmawn: Z. Naturforschg. 11A, 463–72, 1956.

Properties of Elemental and Compound Semiconductors, compilation of papers presented August.–September 1959, Boston, sponsored by AIMME. Published by Interscience Publishers, Inc., N. Y., p. 51 relied upon.

Kolm et al.: Physical Review, vol. 108, No. 4, November 15, 1957, pages 965–971.